US010065218B2

(12) United States Patent
Kitagawa et al.

(10) Patent No.: US 10,065,218 B2
(45) Date of Patent: Sep. 4, 2018

(54) SUBSTRATE PROCESSING METHOD AND SUBSTRATE PROCESSING APPARATUS

(71) Applicant: SCREEN Holdings Co., Ltd., Kyoto (JP)

(72) Inventors: Hiroaki Kitagawa, Kyoto (JP); Katsuhiko Miya, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 23 days.

(21) Appl. No.: 15/067,762

(22) Filed: Mar. 11, 2016

(65) Prior Publication Data
US 2016/0279679 A1 Sep. 29, 2016

(30) Foreign Application Priority Data

Mar. 24, 2015 (JP) .................. 2015-061188

(51) Int. Cl.
| | |
|---|---|
| *B08B 3/10* | (2006.01) |
| *H01L 21/02* | (2006.01) |
| *H01L 21/67* | (2006.01) |
| *B08B 7/00* | (2006.01) |

(52) U.S. Cl.
CPC .............. *B08B 3/10* (2013.01); *B08B 7/0014* (2013.01); *B08B 7/0064* (2013.01); *B08B 7/0092* (2013.01); *H01L 21/02041* (2013.01); *H01L 21/02052* (2013.01); *H01L 21/6704* (2013.01); *H01L 21/67028* (2013.01); *H01L 21/67109* (2013.01)

(58) Field of Classification Search
None
See application file for complete search history.

(56) References Cited

U.S. PATENT DOCUMENTS

| | | | |
|---|---|---|---|
| 2001/0023079 A1 | 9/2001 | Moore et al. ...................... 438/1 |
| 2006/0281649 A1* | 12/2006 | Tanaka ................... B08B 7/0092 |
| | | | 510/108 |
| 2007/0235062 A1 | 10/2007 | Fujiwara et al. ................. 134/4 |
| 2008/0060686 A1 | 3/2008 | Miya et al. ...................... 134/37 |

(Continued)

FOREIGN PATENT DOCUMENTS

| | | | | |
|---|---|---|---|---|
| EP | 0275126 A2 * | 7/1988 | ............ G03F 7/168 |
| JP | 2002-204996 A | 7/2002 | |

(Continued)

OTHER PUBLICATIONS

Office Action dated Mar. 3, 2017 in corresponding Korean Patent Application No. 10-2015-0183907.

(Continued)

*Primary Examiner* — Mikhail Kornakov
*Assistant Examiner* — Natasha N Campbell
(74) *Attorney, Agent, or Firm* — Ostrolenk Faber LLP

(57) ABSTRACT

A solidified body forming step includes: a first step of landing a processing surface of a cooling member on a liquid film to solidify the liquid to be solidified located in an area sandwiched between an upper surface and the processing surface; and a second step of releasing the processing surface from the solidified area solidified in the first step. The processing surface has a lower temperature than a freezing point of the liquid to be solidified. Adhesion between the solidified area and the processing surface is smaller than that between the solidified area and the upper surface.

6 Claims, 12 Drawing Sheets

(56) References Cited

U.S. PATENT DOCUMENTS

| | | | |
|---|---|---|---|
| 2008/0121251 A1 | 5/2008 | Miya et al. | 134/4 |
| 2012/0175819 A1 | 7/2012 | Miya et al. | 264/334 |
| 2012/0186275 A1 | 7/2012 | Kato et al. | 62/64 |

FOREIGN PATENT DOCUMENTS

| | | |
|---|---|---|
| JP | 2008-071875 | 3/2008 |
| JP | 2008-130952 A | 6/2008 |
| JP | 2012-146696 | 8/2012 |
| JP | 2012-169588 | 9/2012 |
| JP | 2013-074232 | 4/2013 |
| TW | I362067 B | 4/2012 |
| TW | I369728 B | 8/2012 |

OTHER PUBLICATIONS

M. Yoshida et al., "Investigation to Prevent Icing(Part I)—Adhesion of Ice to Various Materials," Report No. 292 of Industrial Research Institute of Hokkaido Research Organization, 1993, pp. 13-22 (with English translation).

R. Yamamoto et al., "Adhesion strength tests of pure ice and saline ice using polymer materials," SEPPYO, Journal of the Japanese Society of Snow and Ice, vol. 68, No. 5, Sep. 2006, pp. 433-440 (English abstract on p. 440).

H. Saito et al., "A Study on the Relationship between Roughness and Ice Adhesivness of Water Repellent Surface," Journal of the Surface Finishing Society of Japan, vol. 47, No. 2, 1996, pp. 189-190 (with English translation).

A.J. Meuler et al., "Relationships between Water Wettability and Ice Adhesion," ACS Applied Materials & Interfaces, 2010, 2(11), 31 pages.

Extended European Search Report (EESR) dated Jul. 28, 2016 in the European counterpart EP Application No. 16160127.3.

Office Action dated Jul. 26, 2017 in corresponding Taiwanese Patent Application No. 105109259.

* cited by examiner

SUBSTRATE PROCESSING METHOD AND SUBSTRATE PROCESSING APPARATUS

CROSS REFERENCE TO RELATED APPLICATION

The disclosure of Japanese Patent Application enumerated below including specification, drawings and claims is incorporated herein by reference in its entirety: No.2015-61188 filed on Mar. 24, 2015.

BACKGROUND OF THE INVENTION

1. Field of the Invention

This invention relates to a solidification technique for solidifying liquid films formed on the upper surfaces of various substrates such as semiconductor substrates, glass substrates for photo mask, glass substrates for liquid crystal display, glass substrates for plasma display, substrates for FED (Field Emission Display), substrates for optical disc, substrates for magnetic disc and substrates for opto-magnetic disc (hereinafter, merely written as "substrates") and a substrate processing method and a substrate processing apparatus for cleaning the upper surface of a substrate using the solidification technique.

2. Description of the Related Art

A manufacturing process of an electronic component such as a semiconductor device or a liquid crystal display device includes a step of forming a fine pattern by repeatedly applying processes such as film formation on a surface of a substrate and etching. Here, the substrate surface needs to be kept in a clean state to satisfactorily perform fine processing and a cleaning process is performed on the substrate surface if necessary. For example, in an apparatus described in JP2008-71875A, a liquid such as DIW (DeIonized Water: hereinafter, written as "DIW") is supplied to a substrate surface and, after the liquid is frozen, the frozen liquid is thawed and removed with a rinse liquid, whereby the substrate surface is cleaned.

Specifically, in the apparatus described in JP2008-71875A, the following steps are performed. First, a substrate surface is arranged in a horizontal posture with a surface faced upward and a DIW liquid film is formed on the entire surface of the substrate by supplying DIW to the surface (upper surface) of this substrate. Subsequently, the supply of the DIW is stopped and nitrogen gas having a low temperature is blown toward the surface of the substrate to freeze the DIW liquid film. In this way, the DIW having entered between contaminants such as particles and the surface of the substrate becomes ice and expands, whereby the contaminants such as particles are moved away from the substrate by a minute distance. Further, the DIW expands also in a direction parallel to the surface of the substrate, thereby releasing particles and the like fixed to the substrate. As a result, adhesion between the surface of the substrate and the contaminants such as particles is reduced and the contaminants such as particles are eliminated from the surface of the substrate. Thereafter, by thawing and removing the ice present on the surface of the substrate with the DIW as the rinse liquid, the contaminants such as particles can be efficiently removed from the surface of the substrate.

SUMMARY OF THE INVENTION

However, in the above conventional technique, expensive liquid nitrogen needs to be used to generate nitrogen gas having a low temperature, which is one of main causes for increasing processing cost for forming a solidified body on a surface of a substrate. In addition, since low-temperature gas is used as a cooling medium, the above conventional technique is not necessarily satisfactory also in terms of cooling efficiency. Hence an improvement of a technique for efficiently solidifying a liquid film foamed on a surface of a substrate at low cost is desired.

This invention was developed in view of the above problem and aims to provide a technique for efficiently forming a solidified body on the upper surface of a substrate at low cost.

According to a first aspect of the disclosure, there is provided a substrate processing method. The method comprises a solidified body forming step of forming a solidified body by solidifying a liquid film of a liquid to be solidified formed on an upper surface of a substrate in a horizontal posture using a cooling member, wherein: the solidified body forming step includes a first step of landing a processing surface of the cooling member on the liquid film to solidify the liquid to be solidified located in an area sandwiched between the upper surface and the processing surface, and a second step of releasing the processing surface from a solidified area solidified in the first step; the processing surface has a lower temperature than a freezing point of the liquid to be solidified; and adhesion between the solidified area and the processing surface is smaller than that between the solidified area and the upper surface.

According to a second aspect of the disclosure, there is provided a substrate processing apparatus. The apparatus comprises: a substrate holder that holds a substrate in a horizontal posture, the substrate having an upper surface on which a liquid film of a liquid to be solidified is formed; a cooling member that has a processing surface having a lower temperature than a freezing point of the liquid to be solidified; and a mover that moves the cooling member relative to the upper surface of the substrate held by the substrate holder, wherein: an operation of releasing the processing surface from a solidified area is performed to solidify the liquid film and form a solidified body by moving the cooling member after the cooling member is moved to land the processing surface on the liquid film and the liquid to be solidified located in an area sandwiched between the upper surface and the processing surface is solidified to form the solidified area; and the processing surface is formed of a material whose adhesion to the solidified area is smaller than that between the solidified area and the upper surface.

As described above, according to the invention, the processing surface having a lower temperature than the freezing point of the liquid to be solidified is landed on the liquid film. This makes sure that the liquid to be solidified located in the area sandwiched between the surface of the substrate and the processing surface is efficiently solidified by the processing surface to form the solidified area. However, since the processing surface of the cooling member is directly brought into contact with the liquid, the solidified area adheres not only to the surface of the substrate, but also to the processing surface of the cooling member. Thus, to form the solidified body on the surface of the substrate, the cooling member needs to be released from the solidified area following the above solidifying operation. Accordingly, in the invention, the adhesion between the processing surface of the cooling member and the solidified area is made smaller than that between the surface of the substrate and the solidified area. Therefore, when the cooling member is moved, only the processing surface is released from the solidified area with the solidified area remaining on the surface of the substrate and the solidified body can be efficiently formed on the surface of the substrate at low cost.

The above and further objects and novel features of the invention will more fully appear from the following detailed description when the same is read in connection with the accompanying drawing. It is to be expressly understood, however, that the drawing is for purpose of illustration only and is not intended as a definition of the limits of the invention.

DETAILED DESCRIPTION OF THE PREFERRED EMBODIMENTS

A. Direct Solidification of Liquid Film by Cooling Member

In the apparatus described in JP2008-71875A, a cooling gas discharge nozzle is arranged above and at a distance from a liquid film of DIW formed on a surface (upper surface) of a substrate and cooling gas (e.g. nitrogen gas) having a lower temperature than a freezing point of DIW is blown to the liquid film from the cooling gas discharge nozzle. Thus, a reduction of cooling efficiency caused by the use of a gas component as a cooling medium is unavoidable. Accordingly, the inventors of this application conceived to improve cooling efficiency by cooling at least one surface (hereinafter, referred to as a "processing surface") of a cooling member (solid) to a temperature lower than a freezing point of a liquid film and directly bringing this processing surface into contact with the liquid film to solidify the liquid film. However, to realize such an idea, the following two technical matters need to be studied.

A-1. Releasability of Cooling Member

The first technical matter is the releasability of the cooling member. When the processing surface of the cooling member is landed on the liquid film to solidify the liquid film, an area sandwiched between the surface of the substrate and the processing surface of the cooling member is solidified to adhere to the surface of the substrate. The area solidified in this way also adheres to the processing surface of the cooling member. Thus, to satisfactorily form the solidified body on the surface of the substrate, the processing surface of the cooling member needs to be reliably released from the solidified area, following the above solidifying operation.

Various researches have been and are being made on adhesion of ice frozen on a material surface, i.e. ice adhesion. For example, in "Investigation to Prevent Icing (Part 1) (Report No. 292 of Industrial Research Institute of Hokkaido Research Organization, 1993, pp. 13-22), adhesion of ice to various materials is measured. As reported in this research, fluorine-based materials used in PTFE (polytetrafluoroethylene) and fluororesin coated steel plates, silicon-based materials, PE (polyethylene) and the like have lower ice adhesion (3.3 [kgf/cm$^2$]) than silicon substrates and it is considered that the processing surface can be preferentially released from the solidified area (ice area) by using these as a material constituting the processing surface of the cooling member. Accordingly, the inventors of this application verified the releasability of the cooling member by conducting a verification experiment shown in FIG. 1.

Figure 1:
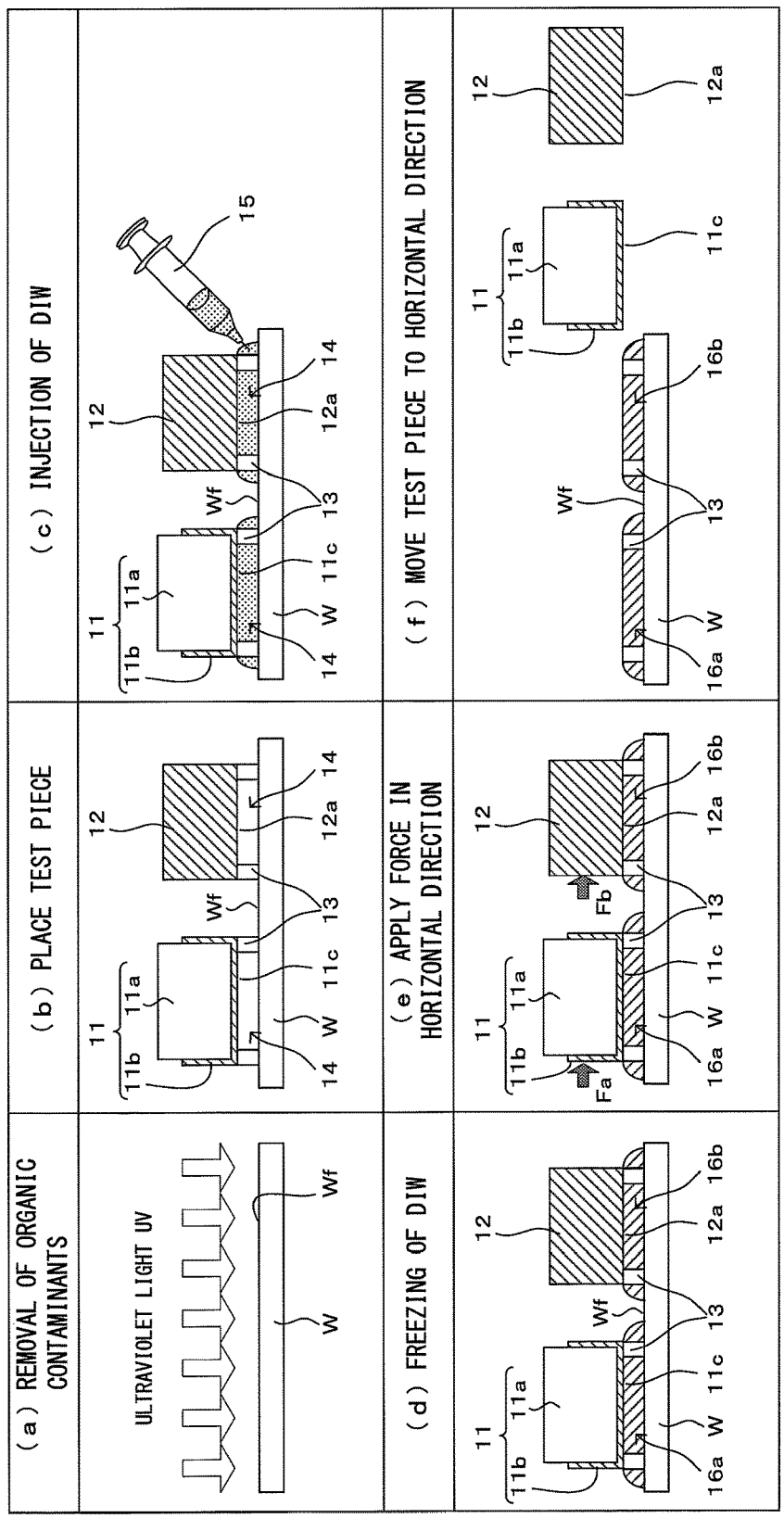
FIG. 1 is a diagram schematically showing the verification experiment for verifying the releasability of the cooling member.

FIG. 1 is a diagram schematically showing the verification experiment for verifying the releasability of the cooling member. To verify the releasability of the cooling member, organic contaminants adhering to a surface Wf of a silicon substrate (hereinafter, merely referred to as a "substrate W") in a horizontal posture are removed by irradiating ultraviolet light UV to the surface Wf (see (a) of FIG. 1). On the other hand, a first test piece 11 in which a PTFE tape 11b is adhered to a lower part of an aluminum substrate 11a and a second test piece 12 obtained by molding PTFE into a block shape are prepared in advance. Then, assuming a lower surface 11c of the first test piece 11 (PTFE surface of the PTFE tape 11b) and a lower surface 12a of the second test piece 12 as "processing surfaces" of the invention, the both test pieces 11, 12 are placed on the surface Wf of the substrate W via a spacer 13 while facing the surface Wf of the substrate W. In this way, the lower surface 11c of the first test piece 11 and the lower surface 12a of the second test piece 12 are located above and at a distance from the surface Wf of the substrate W by a thickness of the spacer 13 to form gap portions 14 as shown in (b) of FIG. 1. Note that, in this verification experiment, the thickness of the spacer 13 is set at 2 mm.

Subsequently, DIW is injected from a syringe 15 into the gap portions 14 between the lower surfaces 11c, 12a of the first and second test pieces 11, 12 and the surface Wf of the substrate W to fill each gap portion 14 with the DIW (see (c) of FIG. 1). In this way, a liquid accreted situation equivalent to a situation where the processing surface of the cooling member is landed on the liquid film of the DIW formed on the surface Wf of the substrate W as shown in embodiments to be described later is constructed. The substrate W kept in such a liquid accreted situation is stored in a refrigerator to freeze the DIW and form solidified areas 16a, 16b (see (d) of FIG. 1). Note that the solidified area 16a is an area obtained by freezing the DIW in an area sandwiched between the lower surface 11c of the first test piece 11 and the surface Wf of the substrate W, and the solidified area 16b is an area obtained by freezing the DIW in an area sandwiched between the lower surface 12a of the second test piece 12 and the surface Wf of the substrate W. Further, although the DIW volumetrically expands during freezing, the solidified areas 16a, 16b escape from the gap portions 14 in a horizontal direction by that volume increase, and the DIW present in the gap portions 14 is solidified while being held in close contact with the surface Wf of the substrate W, the lower surface 11c (processing surface) of the test piece 11 and the lower surface 12a (processing surface) of the test piece 12, thereby forming solidified areas.

When solidification occurs in this way, adhesion generated at each interface:

F11: ice adhesion of the solidified area 16a to the lower surface 11c of the first test piece 11, F12: ice adhesion of the solidified area 16a to the surface Wf of the substrate W, F21: ice adhesion of the solidified area 16b to the lower surface 12a of the second test piece 12, and F22: ice adhesion of the solidified area 16b to the surface Wf of the substrate W is estimated from the above research report to exhibit the following relationship:

$$F11<F12 \qquad (1),$$

and $$F21<F22 \qquad (2).$$

Forces Fa, Fb of the horizontal direction were applied to side surfaces of the test pieces 11, 12 by pressing with fingers of the hand wearing a heat-insulation glove as shown in (e) of FIG. 1. Then the first test piece 11 was released from the solidified area 16a at the interface between the lower surface 11c of the first test piece 11 and the solidified area 16a and the second test piece 12 was released from the solidified area 16b at the interface between the lower surface 12a of the second test piece 12 and the solidified area 16b with the surface Wf of the substrate W and the solidified areas 16a, 16b firmly adhering each other in both of the first and second test pieces 11, 12. In this way, the test pieces 11, 12 are respectively satisfactorily released from the solidified areas 16a, 16b while the solidified areas 16a, 16b of a desired shape are formed on the surface Wf of the substrate W as shown in (f) of FIG. 1.

Thus, as is clear from the verification experiment shown in FIG. 1, even if the processing surface of the cooling member adheres to the solidified area when the liquid film is solidified by the cooling member, the cooling member can be preferentially released from the solidified area and the solidified area can reliably remain on the surface Wf of the substrate W while being kept in a desired shape if the material constituting the processing surface of the cooling member satisfies the following relationship:

(ice adhesion of solidified area to processing surface)<(ice adhesion of solidified area to surface Wf).

Note that although the case of using the DIW as a "liquid to be solidified" of the invention is described here, the same holds true also in the case of using another liquid as the "liquid to be solidified" of the invention.

A-2. Solidification Possibility of Liquid Film by Cooling Member

Although the liquid film is solidified by storing the substrate W in the refrigerator in the above verification experiment, whether or not it is rationally possible to solidify the liquid film by landing the cooling member on the liquid film needs to be verified. Accordingly, the inventors of this application verified a solidification possibility by the cooling member by conducting a verification experiment shown in FIG. 2.

Figure 2:
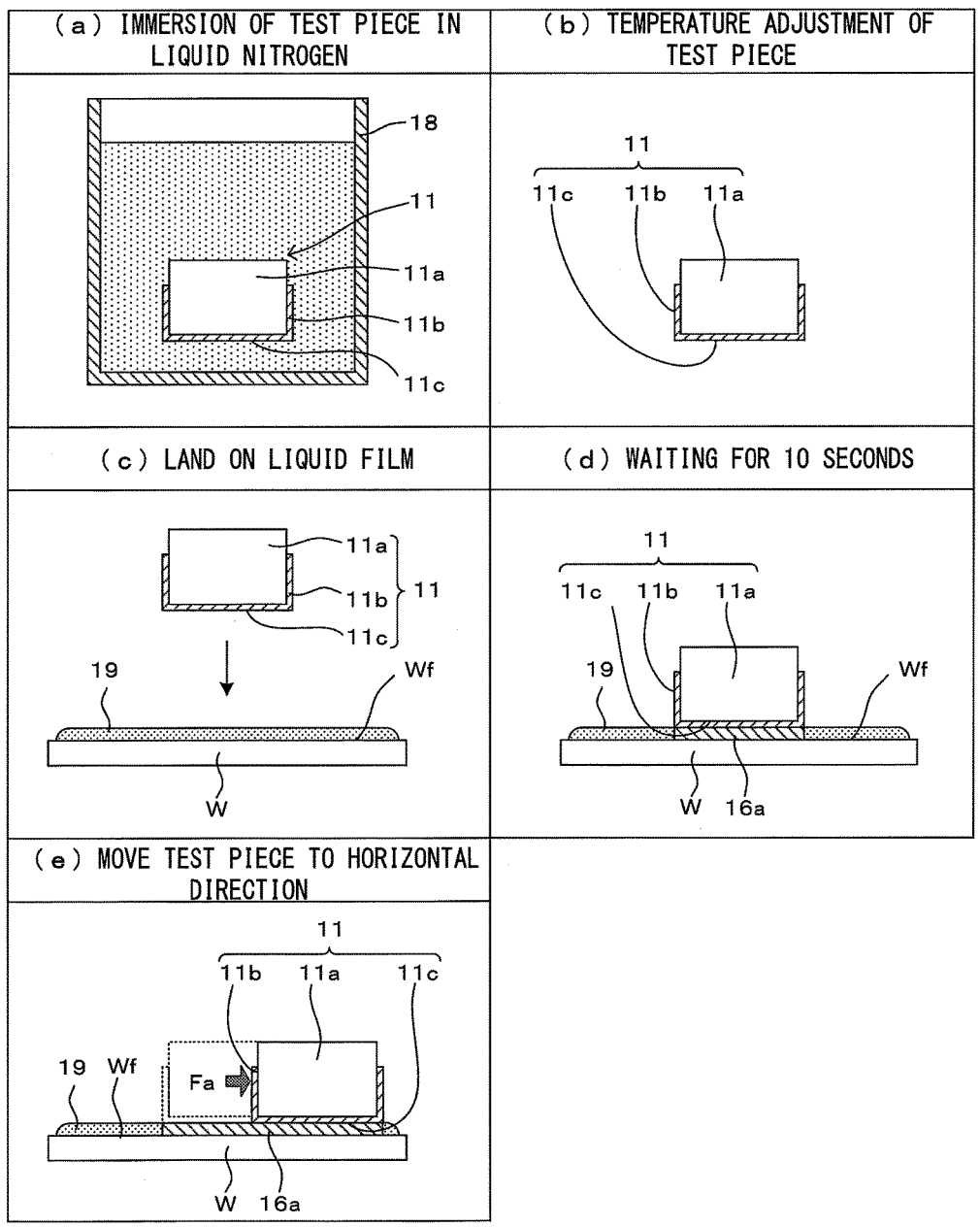
FIG. 2 is a diagram schematically showing the procedure of the verification experiment for verifying the solidification possibility by the cooling member.

FIG. 2 is a diagram schematically showing the procedure of the verification experiment for verifying the solidification possibility by the cooling member. To verify the solidification possibility by the cooling member, a test piece 11 configured similarly to the first test piece used in the verification experiment shown in FIG. 1 is prepared and cooled by being immersed in liquid nitrogen stored in a tank 18 as shown in (a) of FIG. 2. Then, the cooled test piece 11 is taken out of the tank 18 to a room temperature atmosphere and heated until the temperature of an aluminum substrate 11a constituting the test piece 11 reaches −30° C. (see (b) of FIG. 2). Note that the temperature of a processing surface 11c of the test piece 11 adjusted to −30° C. (surface temperature of a PTFE tape 11b) was −10° C.

On the other hand, a substrate W having a liquid film of DIW is prepared in parallel with the cooling and temperature adjustment of the test piece 11. Also in this verification experiment, organic contaminants are removed by irradiating ultraviolet light to a surface Wf of the substrate W and a liquid film 19 of the DIW formed on the surface Wf was at a room temperature (21° C.). Then, the test piece 11 is placed on the surface Wf of the substrate W so that the processing surface 11c of the test piece 11 temperature-adjusted as described above is landed on this liquid film 19 (see (c) of FIG. 2). Further, by waiting for 10 seconds as shown in (d) of FIG. 2, the DIW in an area sandwiched between the lower surface 11c of the test piece 11 and the surface Wf of the substrate W is frozen to form a solidified area 16a. Thereafter, when a force Fa of the horizontal direction was applied to a side surface of the test piece 11 by pressing with fingers of the hand wearing a heat-insulation glove, it was confirmed that the test piece 11 was smoothly released from the solidified area 16a and moved in the horizontal direction and an area of the liquid film 19 through which the test piece 11 had passed was frozen to widen the solidified area 16a in the horizontal direction (see (e) of FIG. 2).

As is clear from the verification experiment shown in FIG. 2, the area sandwiched between the processing surface and the surface Wf of the substrate W can be solidified by landing the processing surface of the cooling member adjusted to the temperature lower than the freezing point of the DIW on the liquid film. In addition, the temperature of the cooling member could be adjusted at about −30° C. and it was confirmed to be rationally possible to solidify the liquid film by directly bringing the cooling member into contact therewith. Further, also in the verification experiment of FIG. 2, it was additionally confirmed that the cooling member could be preferentially released from the solidified area and the solidified area could reliably remain on the surface Wf of the substrate W while being kept in a desired shape.

A-3. Summary

Based on the above two verification experiments, it was elucidated that the solidified area could be formed by directly bringing the processing surface of the cooling member having a lower temperature than the freezing point of the liquid film into contact with the liquid film and that the cooling member could be released from the solidified area while remaining on the surface Wf of the substrate W by moving the cooling member by such a small force generated by pressing by human fingers. Accordingly, the inventors of this application were created embodiments embodying the above idea. Hereinafter, a first embodiment of a substrate processing apparatus and a substrate processing method according to the invention is described in detail with reference to FIGS. 3 to 6.

B. First Embodiment

Figure 3:
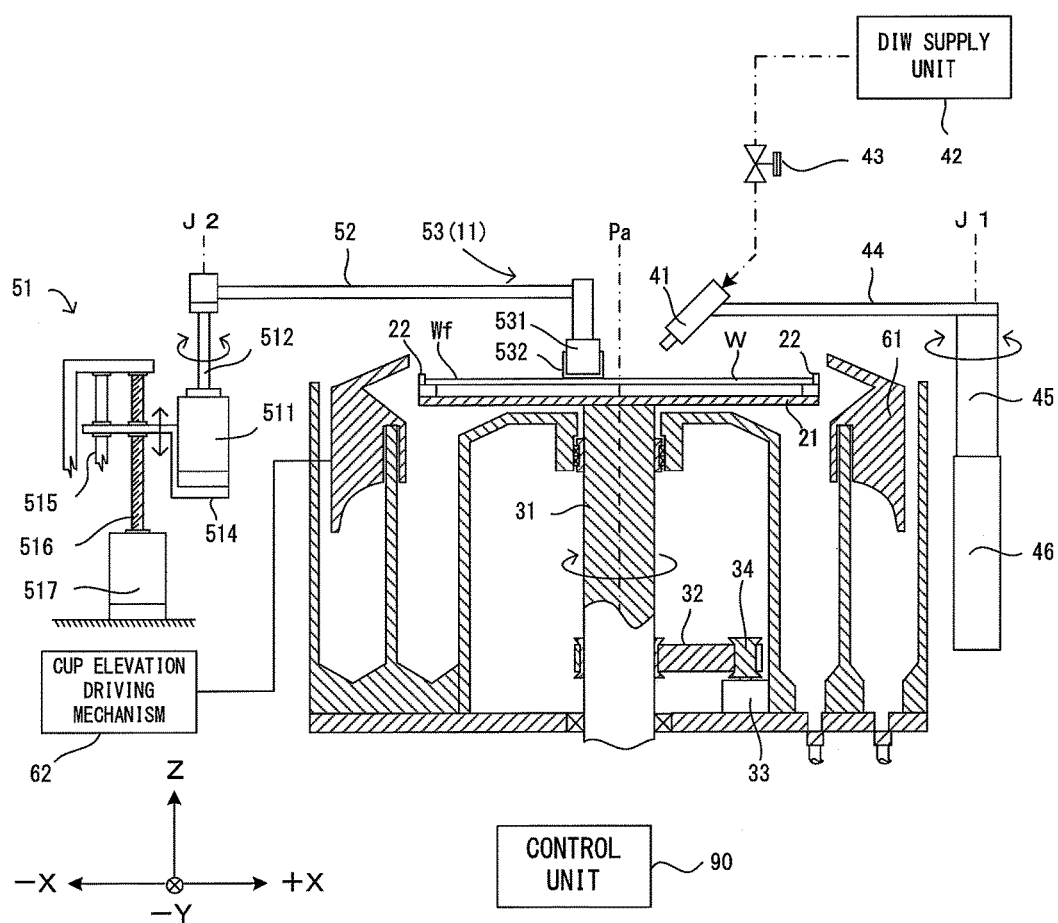
FIG. 3 is a diagram showing a first embodiment of the substrate processing apparatus according to the invention.

FIG. 3 is a diagram showing a first embodiment of the substrate processing apparatus according to the invention.

Figure 4:
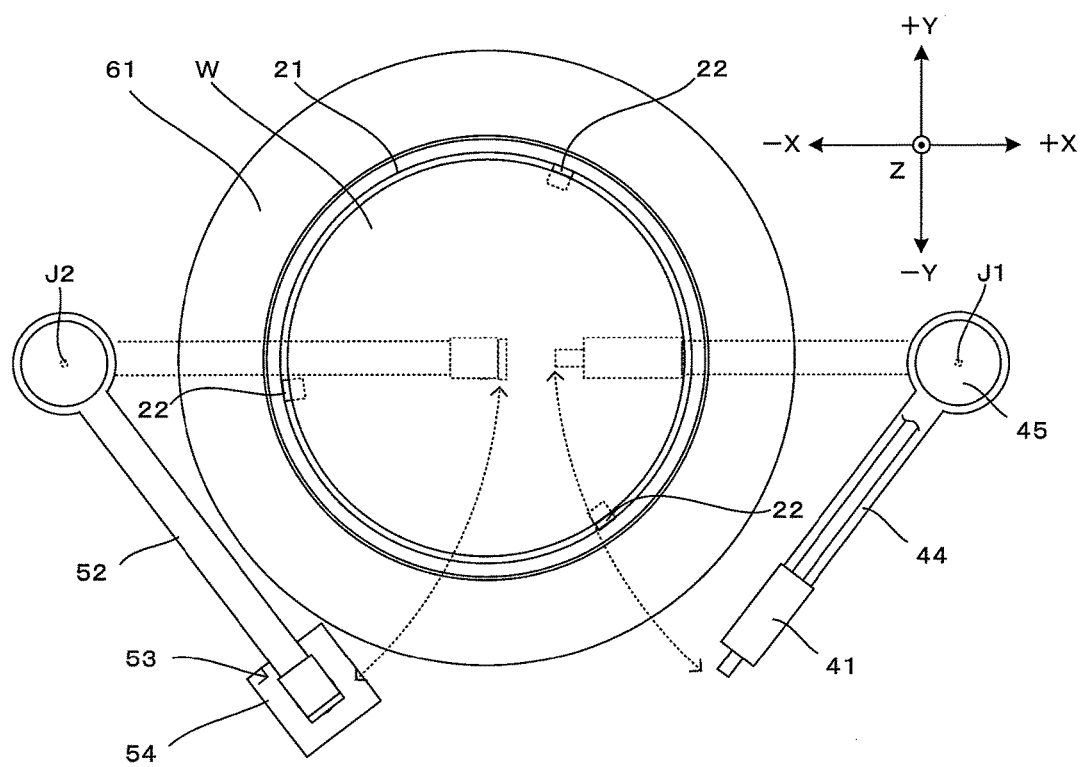
FIG. 4 is a partial plan view of the substrate processing apparatus of FIG. 3.

FIG. 4 is a partial plan view of the substrate processing apparatus of FIG. 3. This substrate processing apparatus is a single substrate processing apparatus used in a cleaning process for removing contaminants such as particles adhering to a surface Wf of a substrate W such as a semiconductor wafer. Note that XYZ orthogonal coordinate axes are shown in FIGS. 3 and 4 to clarify a directional relationship.

This substrate processing apparatus includes a spin base 21 having a plane size slightly larger than the substrate W. Further, a plurality of chuck pins 22 for gripping a peripheral edge part of the substrate W are provided to stand near a peripheral edge part of the spin base 21. It is sufficient to provide three or more chuck pins 22 to reliably hold the circular substrate W and the chuck pins 22 are arranged at equal angular intervals along the peripheral edge part of the spin base 21. Each chuck pin 22 includes a substrate supporting portion for supporting the peripheral edge part of the substrate W from below and a substrate holding portion for holding the substrate W by pressing the outer peripheral end surface of the substrate W supported by the substrate supporting portion. Further, each chuck pin 22 can be switched between a pressing state where the substrate holding portion presses the outer peripheral end surface of the substrate W and a releasing state where the substrate holding portion is separated from the outer peripheral end surface of the substrate W, and the state is switched in response to an operation command from a control unit 90 for controlling the entire apparatus.

More specifically, each chuck pin 22 is set to the releasing state when the substrate W is transferred to the spin base 21 while being set to the pressing state when the cleaning process is performed on the substrate W. When being set to the pressing state, each chuck pin 22 grips the peripheral edge part of the substrate W and the substrate W is held in a horizontal posture while being spaced apart from the spin base 21 by a predetermined distance. In this way, the substrate W is held with the surface Wf thereof faced upward. As just described, the substrate W is held by the spin base 21 and the chuck pins 22 in this embodiment. However, a substrate holding method is not limited to this and the substrate W may be held, for example, by a suction method such as by a spin chuck.

As shown in FIG. 3, a rotary shaft 31 is coupled to the spin base 21. This rotary shaft 31 is coupled to an output rotary shaft 34 of a motor 33 via a belt 32. When the motor 33 operates based on a control signal from the control unit 90, the rotary shaft 31 rotates according to the driving of the motor. In this way, the substrate W held by the chuck pins 22 above the spin base 21 rotates about a rotation axis center Pa together with the spin base 21.

A DIW discharge nozzle 41 for supplying DIW to the surface Wf of the substrate W rotationally driven in this way is arranged at a position above the spin base 21. A DIW supply unit 42 is connected to this DIW discharge nozzle 41 via an on-off valve 43. This on-off valve 43 is normally closed. The on-off valve 43 is opened in response to an open command from the control unit 90 when a liquid film of the DIW is formed on the substrate W and when the substrate W is rinsed as described later. Further, this DIW discharge nozzle 41 is attached to a tip part of a horizontally extending first arm 44. A rear end part of this first arm 44 is supported on a rotary shaft 45 extending in a vertical direction Z, rotatably about a rotation center axis J1. A nozzle driving mechanism 46 is coupled to the rotary shaft 45, and the rotary shaft 45 is driven and rotated about the rotation center axis J1 in response to an operation command from the control unit 90. In this way, the DIW discharge nozzle 41 attached to the tip part of the first arm 44 moves above the surface Wf of the substrate W as shown by dotted line in FIG. 4 and moves to a standby position distant from the substrate W as shown by solid line in FIG. 4.

Further, in this embodiment, a second arm 52 horizontally extends besides the first arm 44. A cooling member 53 is attached to a tip part of the second arm 52, whereas a head driving mechanism 51 is coupled to a rear end part. As shown in FIG. 3, this head driving mechanism 51 includes a rotary motor 511. A rotary shaft 512 of the rotary motor 511 is coupled to the rear end part of the second arm 52. When the rotary motor 511 operates in response to a control signal from the control unit 90, the second arm 52 swings about a rotation center J2 to reciprocate the cooling member 53 between an upper position above a surface central part of the substrate W and a retracted position. Note that, in this specification, an operation and a direction in which the cooling member 53 moves from the retracted position to the upper position above the surface central part of the substrate W are respectively referred to as a "forward operation" and a "forward direction", whereas an operation and a direction in which the cooling member 53 moves from the upper position above the surface central part of the substrate W to the retracted position are respectively referred to as a "backward operation" and a "backward direction".

An elevation base 514 on which the rotary motor 511 is mounted is slidably fitted to a standing guide 515 and threadably engaged with a ball screw 516 provided in parallel to the guide 515. This ball spring 516 is interlocked and coupled to a rotary shaft of an elevation motor 517. Further, this elevation motor 517 operates in response to a control signal from the control unit 90 to vertically elevate and lower the cooling member 53 by rotating the ball screw 516. As just described, the head driving mechanism 51 is a mechanism for elevating, lowering and reciprocating the cooling member 53.

This cooling member 53 is configured similarly to the test piece 11. That is, the cooling member 53 includes a base 531 smaller than the surface Wf of the substrate W and a PTFE tape 532 adhered to a lower part of the base 531, and a lower surface 533 (see FIG. 6A) of the PTFE tape 531 facing the spin base 21 corresponds to the "processing surface" of the invention. When the cooling member 53 is moved to the retracted position by the forward operation, the cooling member 53 is adjusted to a temperature (−30° C. in this embodiment) suitable for thawing and cleaning by a temperature adjusting unit 54 (see FIG. 2) provided at this retracted position. On the other hand, when the cooling member 53 is positioned above the surface central part of the substrate W by the forward operation and further lowered, the processing surface of the cooling member 53 is landed on the liquid film of the DIW formed on the surface Wf of the substrate W to solidify an area sandwiched between the processing surface of the cooling member 53 and the surface Wf of the substrate W. As just described, the cooling member 53 has a function as a freezing head.

Further, a scatter preventing cup 61 is provided to surround the spin base 21 to prevent the DIW from scattering around the substrate W and the spin base 21 while various processes by the substrate processing apparatus such as a liquid film forming process, thawing/releasing process and a rinsing process are performed. Specifically, a cup elevation driving mechanism 62 positions the cup 61 at a predetermined position in response to a control signal from the control unit 90, whereby the cup 61 can laterally surround the substrate W held by the spin base 21 and the chuck pins 22 and collect the DIW scattering from the spin base 21 and the substrate W as shown in FIG. 3.

Figure 5:
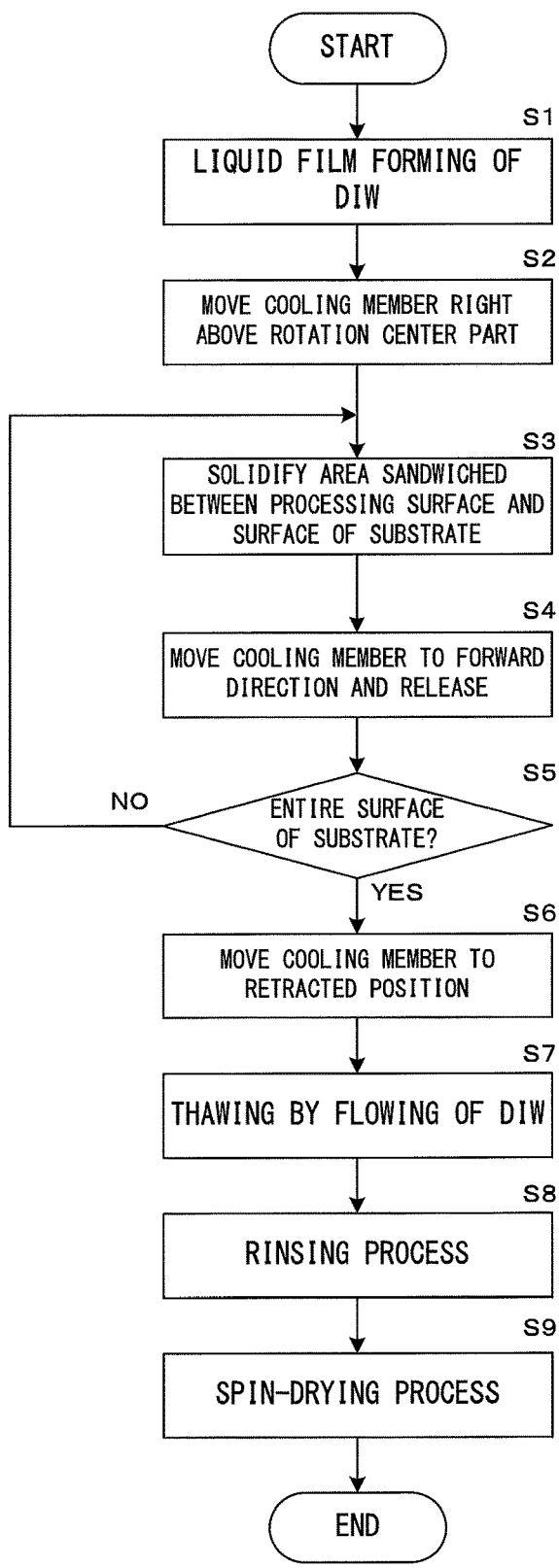
FIG. 5 is a flow chart showing the operation of the substrate processing apparatus shown in FIG. 3.

FIG. 5 is a flow chart showing the operation of the substrate processing apparatus shown in FIG. 3. Further, FIGS. 6A to 6D are diagrams schematically showing the operation of the substrate processing apparatus. In this apparatus, when the unprocessed substrate W is carried into the apparatus, the control unit 90 controls each part of the apparatus to perform a series of processes on the substrate W. Here, the substrate W is loaded into the substrate processing apparatus with the surface Wf faced upward in advance and held by the chuck pins 22.

After the substrate W is carried into, the control unit 90 drives the motor 33 to rotate the spin base 21 and rotates the first arm 44 by the nozzle driving mechanism 46 to move the DIW discharge nozzle 41 to the vicinity of the rotation axis center Pa of the substrate W and position a discharge port (not shown) of the DIW discharge nozzle 41 toward a rotation central part of the surface Wf of the substrate W. Then, the control unit 90 controls the DIW supply unit 42 and the on-off valve 43 to supply the DIW from the DIW supply unit 42 and cause the DIW discharge nozzle 41 to discharge the DIW. The DIW supplied to the central part of the surface Wf of the substrate W uniformly spreads radially outwardly of the substrate W by a centrifugal force associated with the rotation of the substrate W, and a part thereof is spun off the substrate W. In this way, a thickness of the liquid film of the DIW is controlled to be uniform over the entire surface Wf of the substrate W and a liquid film 19 (FIGS. 6A to 6C) having a predetermined thickness is formed on the entire surface Wf of the substrate W (liquid film forming process: Step S1). Note that it is not an essential requirement to spin off the DIW supplied to the surface Wf of the substrate W in forming the liquid film as described above. For example, the liquid film 19 may be formed on the surface Wf of the substrate W without spinning off the DIW from the substrate W in a state where the rotation of the substrate W is stopped or the substrate W is rotated at a relatively low speed. Note that although the next Step S2 follows with the DIW discharge nozzle 41 faced toward the surface Wf of the substrate W in this embodiment, the DIW discharge nozzle 41 may be moved from the upper position above the substrate W to the retracted position (solid line position of FIG. 4) by rotating the first arm 42 in an opposite direction and may be moved and positioned again when the rinsing process is performed as described later.

Figure 6A:
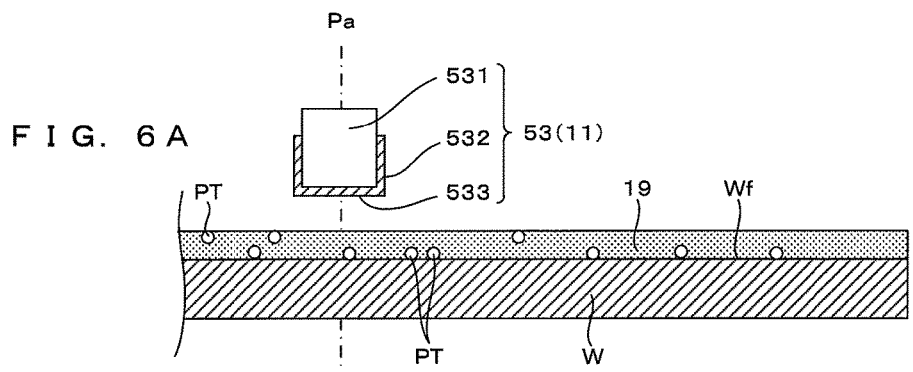
FIGS. 6A to 6D are diagrams schematically showing the operation of the substrate processing apparatus.

In the next Step S2, the control unit 90 stops the rotation of the substrate W and rotates the second arm 52 in the forward direction by the head driving mechanism 51 to move the cooling member 53 to a position right above the rotation center part of the substrate surface Wf and cause the processing surface 533 to face the surface central part of the substrate W (FIG. 6A).

Figure 6B:
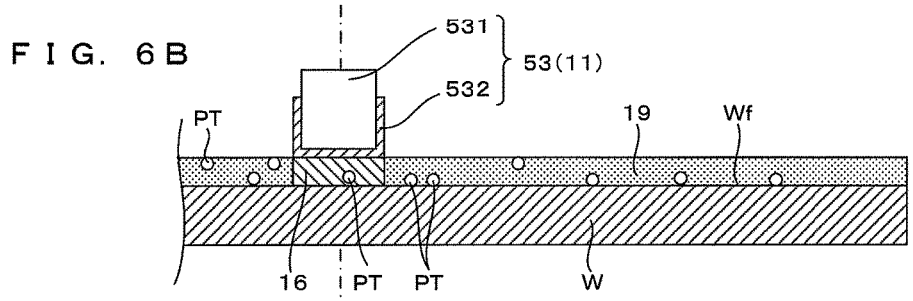

The control unit 90 further controls the head driving mechanism 51 to lower the entire second arm 52 and land the processing surface 533 of the cooling member 53 on the liquid film 19. Then, as shown in FIG. 6B, the DIW in an area of the liquid film 19 sandwiched between the processing surface 533 and the surface Wf of the substrate W is solidified to form a solidified area 16 (Step S3). In this way, particles PT adhering to the surface Wf of the substrate W in this solidified area 16 are separated from original adhering positions and removed from the surface Wf of the substrate W. Note that the position of this cooling member 53 at this time (position of the cooling member 53 shown in FIG. 6B) corresponds to an "initial position" of the present invention.

Figure 6C:
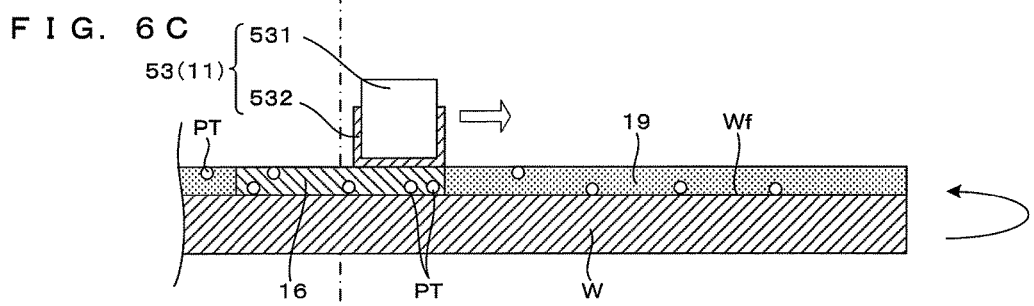

Following that, the control unit 90 resumes the rotation of the substrate W and rotates the second arm 52 in the backward direction by the head driving mechanism 51 to move the cooling member 53 in the backward direction away from the initial position. In this way, as shown in FIG. 6C, the processing surface 533 is released from the solidified area 16 formed in Step S3 (Step S4). Note that since the substrate W rotates about the rotation axis center Pa and the cooling member 53 moves in a radial direction in this embodiment, the processing surface 533 moves in a spiral manner and away from the rotation axis center Pa in the radial direction in a plan view viewed from a vertically upper side. While the processing surface 533 is moving while facing the surface Wf of the substrate W, i.e. until "YES" is determined in Step S5, the DIW solidifying process in the area sandwiched between the processing surface 533 and the surface Wf of the substrate W at a destination of the cooling member 53 (Step S3) and the releasing process (Step S4) are repeated to widen the solidified area 16 in the radial direction.

Figure 6D:
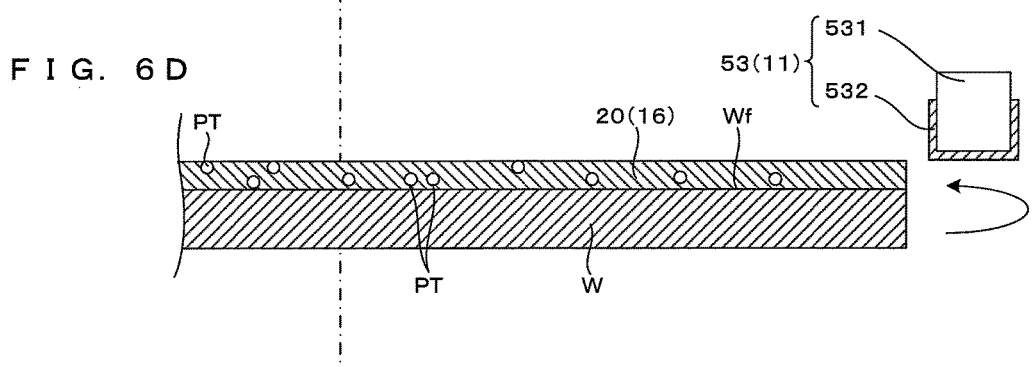

On the other hand, if "YES" is determined in Step S5, i.e. the solidification of the liquid film 19 is completed over the entire surface Wf of the substrate W and a solidified body 20 is formed on the surface Wf (completion of a solidifying/releasing process) as shown in FIG. 6D, the control unit 90 further rotates the second arm 52 in the backward direction by the head driving mechanism 51 to move the cooling member 53 to the retracted position (Step S6). Then, the temperature adjustment of the cooling member 53 by the temperature adjusting unit 54 is performed in preparation for the next solidifying process.

When the solidifying/thawing process is completed in this way, the control unit 90 supplies the DIW to the surface Wf of the substrate W by opening the on-off valve 43. The DIW supplied from the DIW discharge nozzle 41 is caused to flow by a centrifugal force and spreads on the surface Wf of the substrate W and a part of the flowing water thaws the solidified body 20 (thawing process: Step S7). Further, the rinsing process is applied to the surface Wf of the substrate W by continuing the supply of the DIW from the DIW discharge nozzle 41 and the particles removed from the surface Wf of the substrate W by the solidifying/releasing process are removed from the surface Wf of the substrate W together with the DIW (ringing process (removing step): Step S8). When this rinsing process is completed, the control unit 90 stops the supply of the DIW by closing the on-off valve 43 and moves the DIW discharge nozzle 41 to the retracted position distant from the substrate W by the nozzle driving mechanism 46 and, thereafter, the substrate W is spin-dried (spin-drying process: Step S9).

As described above, in this embodiment, the processing surface 533 is landed on the liquid film 19 to solidify the liquid film 19 after the processing surface 533 of the cooling member 53 is adjusted to a temperature lower than the freezing point of the liquid film 19. Thus, the solidified area 16 can be more efficiently formed than the conventional technique using cooling gas. Further, although the cooling member 53 adheres to the solidified area 16 due to the direct contact of the processing surface 533 having a low temperature with the liquid film 19, adhesion between the processing surface 533 of the cooling member 53 and the solidified area 16 is made smaller than that between the surface Wf of the substrate W and the solidified area 16 by forming the processing surface 533 of the PTFE. As a result, the processing surface 533 can be released from the solidified area 16 with the solidified area 16 remaining on the surface Wf of the substrate W by moving the cooling member 53 in the radial direction. As just described, according to this embodiment, the solidified body 20 having a desired shape can be efficiently formed on the surface Wf of the substrate W at low cost.

By applying this solidification technique to a so-called freeze cleaning technique, a time required for freeze-cleaning one substrate W, i.e. a tact time can be drastically shortened and the cost of freeze cleaning can be suppressed.

C. Second Embodiment

Figure 7:
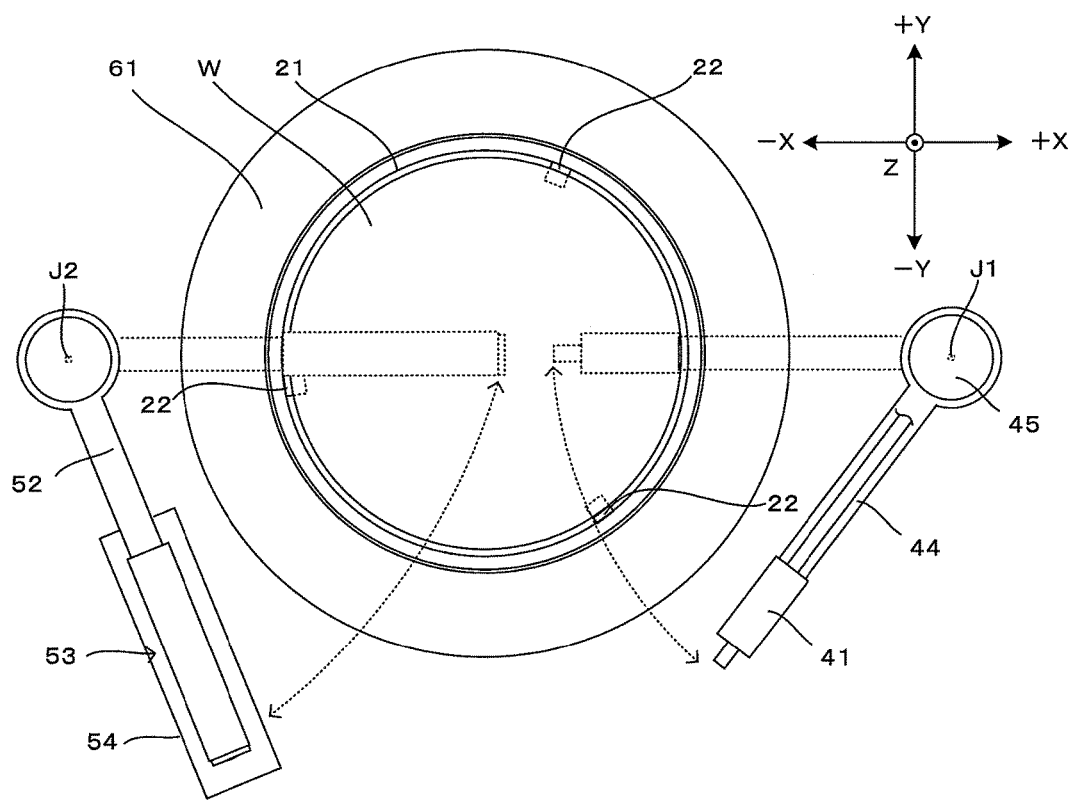
FIG. 7 is a diagram showing a second embodiment of the substrate processing apparatus according to the invention.
Figure 8A:
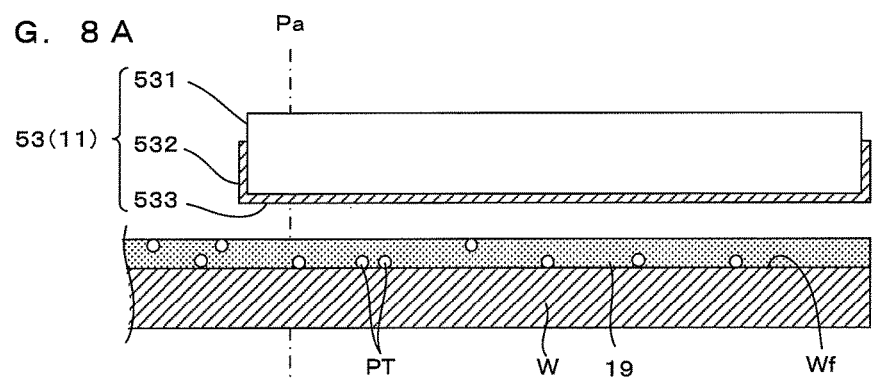
FIGS. 8A to 8C are partial plan views of the substrate processing apparatus of FIG. 7.
Figure 8B:
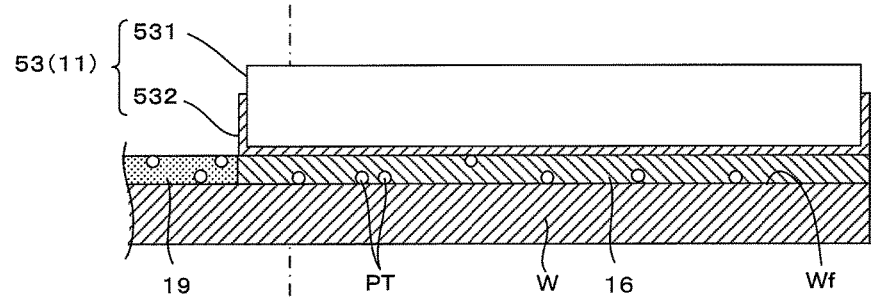
Figure 8C:
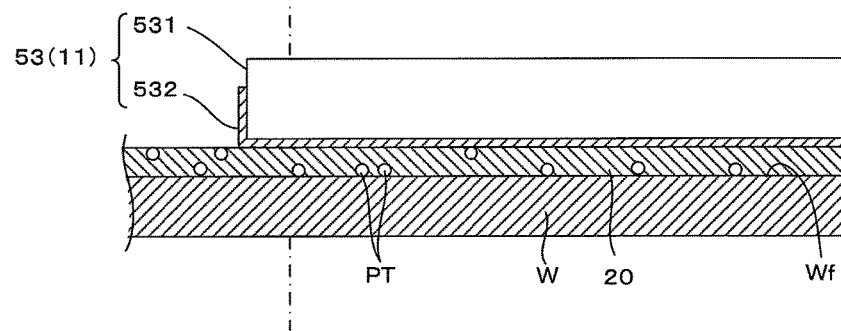

FIG. 7 is a diagram showing a second embodiment of the substrate processing apparatus according to the invention. FIGS. 8A to 8C are partial plan views of the substrate processing apparatus of FIG. 7. The second embodiment largely differs from the first embodiment in the configuration of a cooling member 53, i.e. in that the cooling member 53 extends in a direction parallel to a second arm 52. When a control unit 90 rotates the second arm 52 in a forward direction by a head driving mechanism 51 to move a tip part of the cooling member 53 to a position right above a rotation center part of a substrate surface Wf as shown by dotted line in FIG. 7 and in FIG. 8A, a processing surface 533 of the cooling member 53 faces a surface area from a surface central part to a surface peripheral edge part of the substrate W. Specifically, the processing surface 533 has a rectangular shape having a length equal to or longer than a distance from the rotation center part to an end edge part of the substrate W. Further, as the shape of the cooling member 53 is changed, a temperature adjusting unit 54 extends in a direction parallel to the second arm 52 positioned at a retracted position as shown in FIG. 7. Note that since the other components are the same as in the first embodiment, the same components are denoted by the same reference signs and not described.

Also in the second embodiment thus configured, when the unprocessed substrate W is carried into the apparatus, a liquid film 19 having a predetermined thickness is formed on the entire surface Wf of the substrate W after the substrate W is held by chuck pins 22 with the surface Wf faced upward (liquid film forming process). Following that, the control unit 90 stops the rotation of the substrate W and rotates the second arm 52 by the head driving mechanism 51 in the forward direction to position the cooling member 53 in a state extending from the position right above the rotation center part of the surface Wf of the substrate W to a position right above a (−X) side end edge part of the surface Wf of the substrate W (FIG. 8A).

The control unit 90 further controls the head driving mechanism 51 to lower the entire second arm 52 and land the processing surface 533 of the cooling member 53 on the liquid film 19. Then, as shown in FIG. 8B, DIW in an area of the liquid film 19 sandwiched between the processing surface 533 and the surface Wf of the substrate W is solidified and a solidified area 16 having a rectangular shape radially longer than in the first embodiment is formed at once. Note that, in this second embodiment, the position of the cooling member 53 at this time (position of the cooling member 53 shown in FIG. 8B) corresponds to the "initial position" of the invention.

Following that, the control unit 90 resumes the rotation of the substrate W with the cooling member 53 kept stationary and rotates the substrate W at least one turn. In this way, the solidified body 20 is formed on the entire surface Wf of the substrate W as shown in FIG. 8C. Thereafter, the control unit 90 controls a movement of the second arm 52 by the head driving mechanism 51 to completely release the cooling member 53 from the solidified body 20 and, further, move the cooling member 53 to the retracted position. Then, the temperature of the cooling member 53 is adjusted by the temperature adjusting unit 54 in preparation for the next solidifying process. When the solidifying/releasing process is completed in this way, the control unit 90 performs the thawing process, the rinsing process and the spin-drying process for the solidified body 20 as in the first embodiment.

As described above, also in the second embodiment, the processing surface 533 having a lower temperature than the freezing point of the liquid film 19 is landed on the liquid film 19 to solidify the liquid film 19 and the processing surface 33 is formed of PTFE. Thus, the solidified body 20 having a desired shape can be efficiently formed on the surface Wf of the substrate W at low cost. Further, since the area of the solidified area 16 formed at once is wider in the second embodiment than in the first embodiment, a time required for freeze-cleaning one substrate W, i.e. a so-called tact time can be shortened and throughput can be further improved. Note that although the processing surface 533 is finished into a rectangular shape extending in the direction parallel to the second arm 52 (length direction) in the second embodiment, it may be finished into another shape such as an elliptical shape or a rectangular shape with rounded corners.

D. Third Embodiment

Figure 9A:
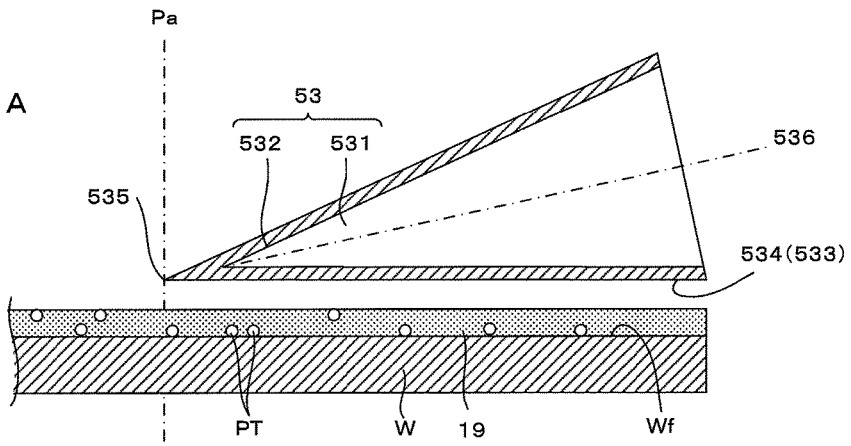
FIGS. 9A to 9C are diagrams showing the third embodiment of the substrate processing apparatus according to the invention.
Figure 9B:
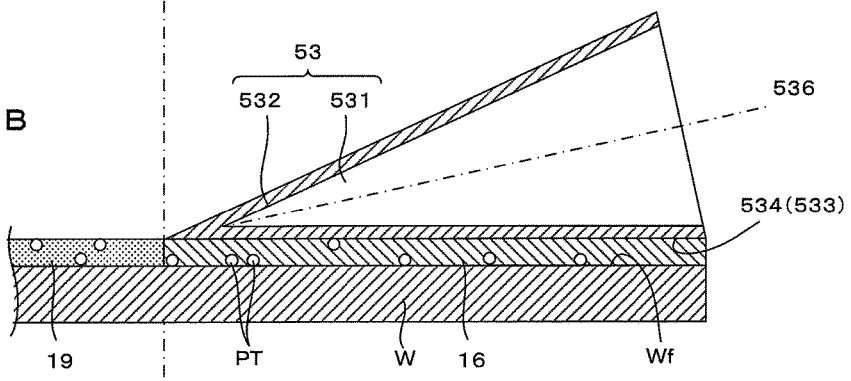
Figure 9C:
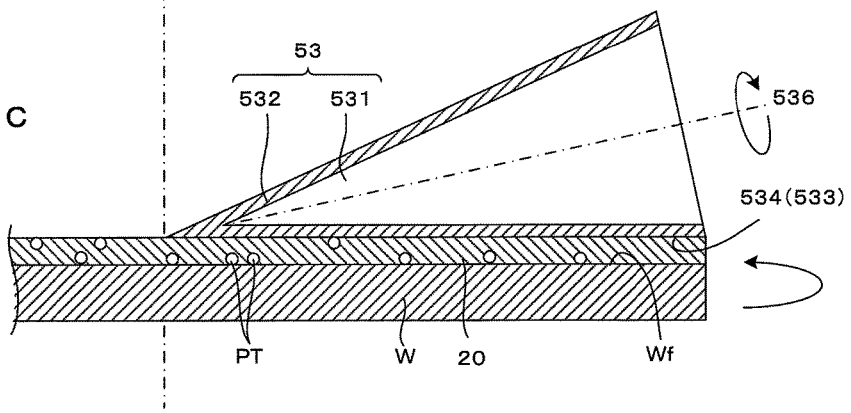

Although the cooling member 53 is finished into a rectangular parallelepipedic shape in the above second embodiment, it may be finished into a right circular conical shape as shown in FIGS. 9A to 9C. A third embodiment is described below with reference to FIGS. 9A to 9C.

FIGS. 9A to 9C are diagrams showing the third embodiment of the substrate processing apparatus according to the invention. In the third embodiment, a right circular conical cooling member 53 having a generatrix 534 longer than a radius of a substrate W is used. The cooling member 53 is such that a tip part and a side surface of a right circular conical base 531 are coated with PTFE and a circular conical surface functions as a processing surface 533. The right circular conical cooling member 53 can be driven to move toward and away from a surface Wf of the substrate W by an unillustrated head driving mechanism. Further, the right circular conical cooling member 53 is configured to be rotatable about a rotation axis center 536 extending from a tip 535 to a bottom surface central part as a rotation center. Note that since the other components are the same as in the first embodiment, the same components are denoted by the same reference signs and not described.

Also in the third embodiment thus configured, when the unprocessed substrate W is carried into the apparatus, a liquid film 19 having a predetermined thickness is formed on the entire surface Wf of the substrate W after the substrate W is held by chuck pins 22 with the surface Wf faced upward (liquid film forming process). Following that, the control unit 90 stops the rotation of the substrate W and positions the cooling member 53 by the head driving mechanism such that the tip 535 is located at a position right above a rotation center part of the surface Wf of the substrate W and the generatrix 534 extends in parallel to the surface Wf up to a position right above an end edge part of the surface Wf of the substrate W (FIG. 9A).

The control unit 90 further controls the head driving mechanism to lower the cooling member 53 vertically downwardly and land the processing surface 533 of the cooling member 53 on the liquid film 19. Then, as shown in FIG. 9B, DIW in an area of the liquid film 19 sandwiched between the processing surface 533 and the surface Wf of the substrate W is solidified to form a linear solidified area 16 long in a radial direction at once. Note that, in this third embodiment, the position of this cooling member 53 at this time (position of the cooling member 53 shown in FIG. 9B) corresponds to the "initial position" of the present invention.

Following that, the control unit 90 drives and rotates the substrate W at least one turn about a rotation axis center Pa and drives and rotates the cooling member 53 about the rotation axis center 536 in synchronization with the rotation of the substrate. In this way, a solidified body 20 is formed on the entire surface Wf of the substrate W as shown in FIG. 9C. Thereafter, the control unit 90 stops the rotation of the cooling member 53 after elevating the cooling member 53 vertically by the head driving mechanism. Of course, the cooling member 53 may be elevated vertically after or at the same time as the rotation is stopped. Then, the temperature of the cooling member 53 is adjusted by a temperature adjusting unit (not shown) in preparation for the next solidifying process. When the solidifying/releasing process is completed in this way, the control unit 90 performs the thawing process, the rinsing process and the spin-drying process for the solidified body 20 as in the first embodiment.

As described above, also in the third embodiment, the processing surface 533 having a lower temperature than the freezing point of the liquid film 19 is landed on the liquid film 19 to solidify the liquid film 19 and the processing surface 33 is formed of PTFE. Thus, the solidified body 20 having a desired shape can be efficiently formed on the surface Wf of the substrate W at low cost.

E. Fourth Embodiment

In the above embodiments, the cooling member 53 is landed on the liquid film 19 after the liquid film 19 is formed on the surface Wf of the substrate W (liquid film forming process). However, a solidified body 20 may be formed by supplying DIW from a cooling member 53 as shown in FIG. 10.

Figure 10:
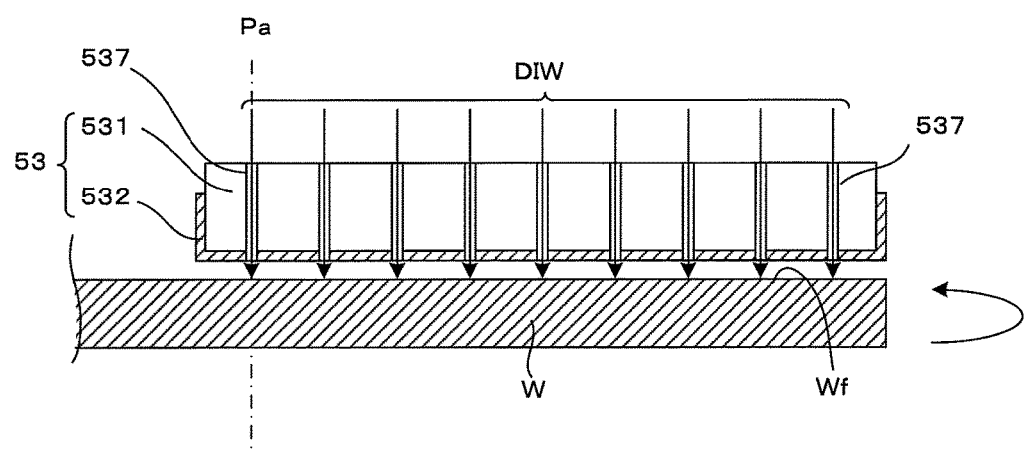
FIG. 10 is a diagram showing a fourth embodiment of the substrate processing apparatus according to the invention.

FIG. 10 is a diagram showing a fourth embodiment of the substrate processing apparatus according to the invention. This fourth embodiment largely differs from the second embodiment in that a plurality of through holes 537 are provided on the cooling member 53 and DIW fed from a DIW supply unit 42 (see FIG. 3) can be supplied between a processing surface 533 and a surface Wf of a substrate W via each through hole 537. By using the cooling member 53 thus configured, the liquid film forming process can be omitted.

F. Fifth Embodiment

In any of the above embodiments, the processing surface 533 of the cooling member 53 is narrower than the surface Wf of the substrate W and the solidified body 20 is formed by moving the cooling member 53 relative to the surface Wf of the substrate W while a part of the liquid film 19 is solidified to form the solidified area 16. However, as shown in FIG. 11, a solidified body 20 may be formed by releasing a cooling member 53 after a liquid film 19 is solidified at once by the cooling member 53.

Figure 11A:
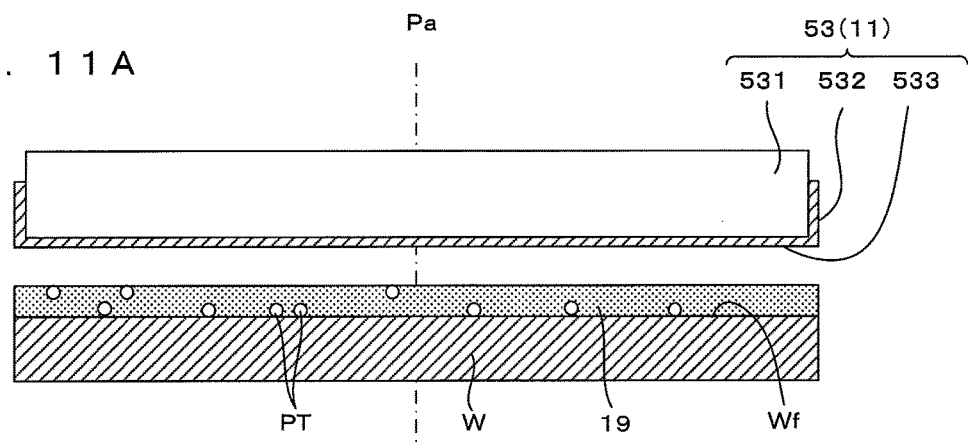
FIGS. 11A to 11C are diagrams showing a fifth embodiment of the substrate processing apparatus according to the invention.
Figure 11B:
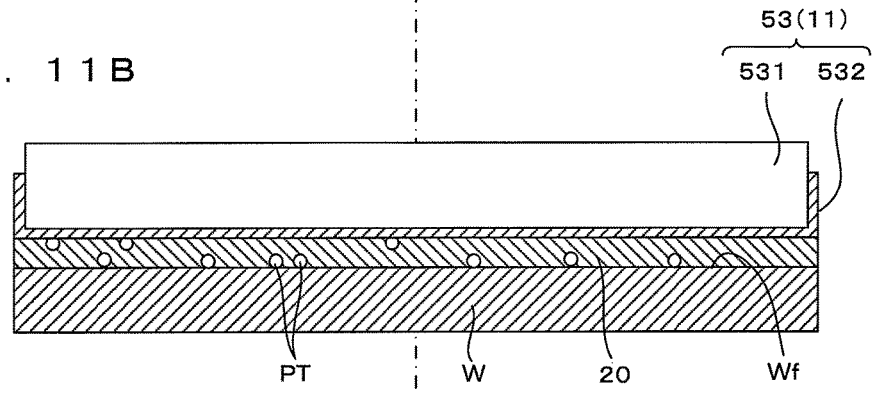
Figure 11C:
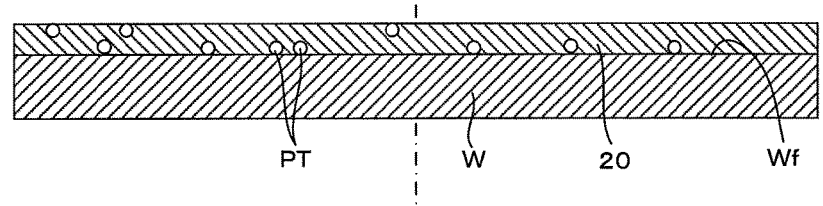

FIGS. 11A to 11C are diagrams showing a fifth embodiment of the substrate processing apparatus according to the invention. This fifth embodiment largely differs from the first embodiment in that a cooling member 53 has a processing surface 533 having the same shape as a surface Wf of a substrate W and that the cooling member 53 is movable among a right upper position above the substrate W, a liquid landing position where the processing surface 533 of the cooling member 53 is landed on a liquid film 19 and a retracted position distant from the right upper position and the liquid landing position by an unillustrated head driving mechanism. Note that since the other components are basically the same as in the first embodiment, the same components are denoted by the same reference signs and not described.

Also in the fifth embodiment thus configured, when the unprocessed substrate W is carried into the apparatus, the liquid film 19 having a predetermined thickness is formed on the entire surface Wf of the substrate W after the substrate W is held by chuck pins 22 with the surface Wf faced upward (liquid film forming process). Following that, the control unit 90 stops the rotation of the substrate W and positions the cooling member 53 W to the right upper position above the surface Wf of the substrate W by the head driving mechanism (FIG. 11A). In this way, the entire liquid film 19 is covered from a vertically upper side with the processing surface 533 of the cooling member 53.

The control unit 90 further controls the head driving mechanism to lower the cooling member 53 and land the processing surface 533 of the cooling member 53 on the liquid film 19. Then, as shown in FIG. 11B, the entire liquid film 19 is solidified to form a solidified body 20 at once. Following that, the control unit 90 controls the head driving mechanism to move the cooling member 53 to the retracted position (FIG. 11C) and the temperature of the cooling member 53 is adjusted by a temperature adjusting unit (not shown) in preparation for the next solidifying process. When the solidifying/releasing process is completed in this way, the control unit 90 performs the thawing process, the rinsing process and the spin-drying process for the solidified body 20 as in the first embodiment.

As described above, also in the fifth embodiment, the processing surface 533 having a lower temperature than the freezing point of the liquid film 19 is landed on the liquid film 19 to solidify the liquid film 19 and the processing surface 33 is formed of PTFE. Thus, the solidified body 20 having a desired shape can be efficiently formed on the surface Wf of the substrate W at low cost. Further, since the solidified body 20 is formed at once in the fifth embodiment, a tact time can be further shortened and throughput can be further improved.

Note that although the cooling member 53 has the processing surface 533 having the same shape as the surface Wf of the substrate W in the fifth embodiment, a cooling member 53 having a processing surface 533 wider than the surface Wf of the substrate W may be used and each part of the liquid film 19 may be simultaneously cooled and solidified by the processing surface 533 of the cooling member 53.

G. Miscellaneous

In the above embodiments, the substrate W is held in the horizontal posture in which the surface Wf is faced upward by the spin base 21, the surface Wf of the substrate W corresponds to an example of an "upper surface of a substrate" of the invention, and the spin base 21 and the chuck pins 22 correspond to an example of a "substrate holder" of the invention. Further, the surface central part of the substrate W corresponds to an "upper surface central part" of the invention. Further, Steps S3, S4 respectively correspond to a "first step" and a "second step" of the invention and a step including these corresponds to an example of a "solidified body forming step" of the invention. Further, Step S8 corresponds to an example of a "removing step". Furthermore, the head driving mechanism 51 and the DIW discharge nozzle 41 respectively correspond to examples of a "mover" and a "remover" of the invention.

Note that the invention is not limited to the embodiments described above and various changes other than those described above can be made without departing from the gist of the invention. For example, although an assembly of the base 531 and the PTFE tape 532 adhered to the lower part of the base 531 is used as the cooling member 53 in the above embodiments, a PTFE block molded into a desired shape similarly to the second test piece 12 of FIG. 1 may be used as the cooling member 53. In this case, the lower surface of the PTFE block functions as a processing surface.

Further, although the processing surface 533 is formed of PTFE in the above embodiments, the processing surface 533 may be formed of a material whose adhesion to the solidified area 16 is smaller than that between the solidified area 16 and the surface (upper surface) Wf of the substrate W such as a fluorine-based material other than PTFE, a silicon-based material or PE.

Figure 12:
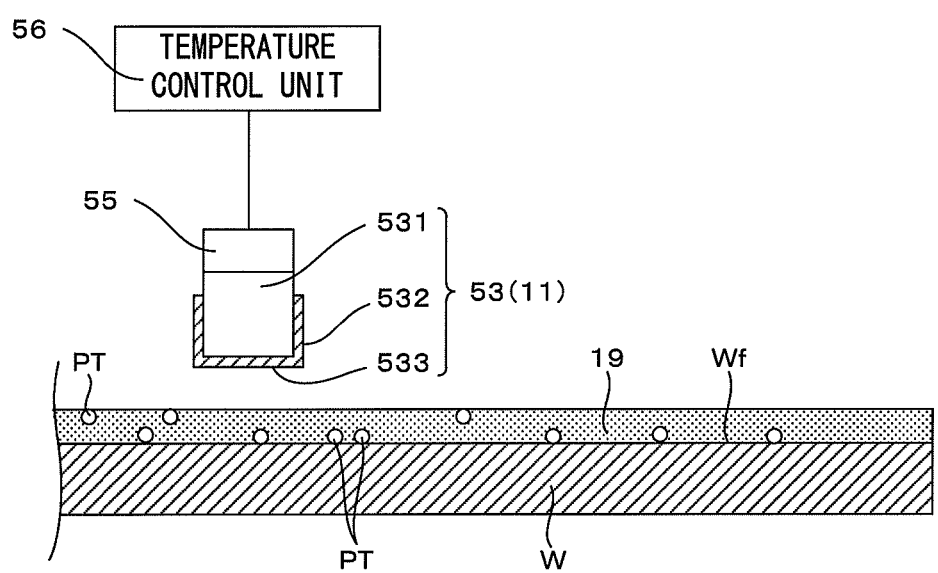
FIG. 12 is a diagram showing another embodiment of the substrate processing apparatus according to the invention.

Further, although the cooling member 53 is moved to the retracted position and the temperature of the cooling member 53 is adjusted in preparation for the next solidifying/releasing process by the temperature adjusting unit 54 at the retracted position in the above embodiments, a configuration as shown in FIG. 12 may be, for example, adopted. In this embodiment, a temperature adjusting mechanism 55 may be attached to the cooling member 53 and the temperature of the processing surface 533 of the cooling member 53 may be adjusted in real time upon receiving an electrical signal or refrigerant from a temperature control unit 56. This is suitable since the solidifying process by the cooling member 53 can be performed with high in-plane uniformity.

Further, although the DIW is supplied as a liquid to be solidified to the substrate W in the above embodiments, the liquid to be solidified is not limited to the DIW and a liquid such as pure water, ultrapure water, hydrogen water, carbonated water or further SC1 may also be used.

Further, although the DIW is supplied to the substrate W to thaw (melt) and remove the solidified body 20 in each of the above embodiments, a thawing liquid or melting liquid is not limited to the DIW and a liquid such as pure water, ultrapure water, hydrogen water, carbonated water or further SC1 may also be used.

Further, although the liquid to be solidified and the thawing liquid (melting liquid) are the same DIW in each of the above embodiments, they can be separate liquids.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

What is claimed is:

1. A substrate processing method, comprising
a solidified body forming step of forming a solidified body by freezing a liquid film of a liquid to be solidified formed on an upper surface of a substrate in a horizontal posture using a cooling member, wherein:
the solidified body forming step includes a first step of landing a processing surface of the cooling member on the liquid film to freeze the liquid to be solidified located in an area sandwiched between the upper surface and the processing surface, and a second step of releasing the processing surface from a solidified area solidified in the first step;
the processing surface has a lower temperature than a freezing point of the liquid to be solidified; and
a first adhesion between the solidified area and the processing surface is smaller than a second adhesion between the solidified area and the upper surface, the first and second adhesions being generated when solidification of the liquid film occurs in the first step.

2. The substrate processing method according to claim 1, wherein:
the processing surface is narrower than the upper surface; and
the solidified body forming step includes performing the first step while arranging the cooling member at an initial position such that the processing surface faces a part of the upper surface and then performing the second step and the first step while relatively moving the cooling member in a horizontal direction from the initial position.

3. The substrate processing method according to claim 2, wherein:
the initial position is a position above an upper surface central part of the substrate; and
the solidified body forming step includes relatively moving the cooling member in a direction away from the initial position to widen the solidified area in a radial direction so as to form the solidified body.

4. The substrate processing method according to claim 2, wherein:
the processing surface has a long shape having a length equal to or longer than a distance from a rotation center part of the substrate to an end edge part of the substrate;
the cooling member is so arranged at the initial position that one end part of the processing surface in a length direction is located above the rotation center part of the substrate and the other end part of the processing surface in the length direction is located above the end edge part of the substrate; and
the solidified body forming step includes rotating the substrate with the rotation center part as a rotation center to widen the solidified area in a rotating direction while positioning the cooling member to the initial position so as to form the solidified body.

5. The substrate processing method according to claim 1, wherein:
the processing surface has the same shape as the upper surface or is wider than the upper surface; and
the solidified body forming step includes performing the first step while arranging the cooling member so as to cover the upper surface from a vertically upper side with the processing surface and then performing the second step by moving the cooling member relative to the substrate.

6. The substrate processing method according to claim 1, further comprising a removing step of removing the solidified body from the upper surface.

* * * * *